US006350628B1

(12) United States Patent
Cheng et al.

(10) Patent No.: US 6,350,628 B1
(45) Date of Patent: Feb. 26, 2002

(54) METHOD OF FABRICATING A FIELD EMISSION DEVICE ON THE SIDEWALLS OF HOLES FORMED IN AN INSULATOR LAYER

(75) Inventors: Huang-Chung Cheng, Hsinchu; Wei Kai Hong, Taipei Hsien; Fu Gow Tarntair, Taipei, all of (TW)

(73) Assignee: National Science Council, Taipei (TW)

( * ) Notice: Subject to any disclaimer, the term of this patent is extended or adjusted under 35 U.S.C. 154(b) by 0 days.

(21) Appl. No.: 09/482,497

(22) Filed: Jan. 13, 2000

(30) Foreign Application Priority Data

Nov. 22, 1999 (TW) ........................................ 088120345

(51) Int. Cl.[7] ................................................ H01L 21/00

(52) U.S. Cl. ............................. 438/20; 445/49; 445/50; 313/310

(58) Field of Search .............................. 438/20; 445/50, 445/49; 313/310

(56) References Cited

U.S. PATENT DOCUMENTS 5,203,731 A * 4/1993 Zimmerman
5,382,185 A * 1/1995 Gray et al.
5,457,355 A * 10/1995 Fleming et al.
5,769,679 A * 6/1998 Park et al.
5,798,568 A * 8/1998 Abercrombie et al.

FOREIGN PATENT DOCUMENTS

EP 0 834 897 A1 * 4/1998
WO WO-96/18206 A1 * 6/1996

* cited by examiner

*Primary Examiner*—Charles Bowers
*Assistant Examiner*—Stephen W. Smoot
(74) *Attorney, Agent, or Firm*—Christensen O'Connor Johnson & Kindness PLLC

(57) ABSTRACT

A method of fabricating a field emission device is disclosed. A conductive layer is etched back by means of a reactive ion etching (RIE) process to form a chimney-shaped structure of diode-type or triode-type to serve as a field emitter. The field emission device of the present invention can be manufactured at a temperature of below 400° C., without complicated techniques or equipment, and is suitable for application in flat panel displays having large area.

17 Claims, 3 Drawing Sheets

METHOD OF FABRICATING A FIELD EMISSION DEVICE ON THE SIDEWALLS OF HOLES FORMED IN AN INSULATOR LAYER

FIELD OF THE INVENTION

The present invention relates to a manufacturing process for a field emission device. More particularly, it relates to a method of fabricating a field emission device having a chimney-shaped emitter for increasing emission area, thereby being suitable for application to a flat panel display.

DESCRIPTION OF THE RELATED ART

Field emission devices are typically manufactured by the method set forth by C. A. Spindt in 1968. However, Spindt's method does not use standard integrated circuit (IC) techniques. Complicated equipment such as an oblique-angle evaporator for depositing a lift-off layer are required using Spindt's method to fabricate a field emission device. Another method for manufacturing a field emission device utilizing IC techniques uses silicon material as an emitter and may produce emitter tips using an oxidation sharpening method. Field emission devices manufactured by this method can be fabricated easily and at low cost. However, the method is carried out at a high temperature. Thus, field emission devices produced by this method cannot be applied to a flat panel display having a large area.

SUMMARY OF THE INVENTION

In view of the above disadvantages, an object of the invention is to provide a method of fabricating a field emission device, which can be fabricated by standard IC techniques and equipment.

Another object of the invention is to provide a method of fabricating a field emission device, which can be fabricated at a temperature below 400° C.

The above objects are attained by providing a first method of fabricating a field emission device (diode-type) on a semiconductor substrate, comprising the steps of: (a) forming an insulating layer over said semiconductor substrate; (b) selectively etching said insulating layer to form an insulating structure having a hole exposing the surface of said semiconductor substrate; (c) depositing a conductive layer on the upper surface and sidewalls of said insulating structure; (d) etching back said conductive layer, thereby leaving a chimney-shaped conductive emitter remaining on said sidewalls of said insulating structure; and (e) wet etching a portion of said insulating structure so that the upper surface of said insulating structure is lower than that of said emitter.

The above objects are attained by providing a second method of fabricating a field emission device (triode-type) on a semiconductor substrate, comprising the steps of: (a) sequentially forming a first insulating layer, a conductive layer for a gate, and a second insulating layer over said semiconductor substrate; (b) selectively etching said second insulating layer, said conductive layer, and said first insulating layer to form a stack structure having a hole exposing the surface of said semiconductor substrate; (c) forming an insulating spacer on the sidewalls of said stack structure; (d) forming a conductive spacer as a field emitter onto said insulating spacer; and (e) wet etching said second insulating layer and the top of said insulating spacer so that the upper surface of said insulating spacer is lower than that of said emitter.

BRIEF DESCRIPTION OF THE DRAWINGS

The preferred embodiment of the invention is hereinafter described with reference to the accompanying drawings in which.

DESCRIPTION OF THE PREFERRED EMBODIMENTS

First Embodiment

FIG. 1A through 1E illustrate a process flow for fabricating a diode field emission device.

Figure 1A:
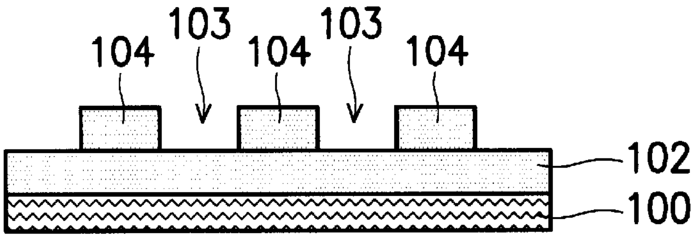
FIGS. 1A through 1E are cross-sectional side views showing the manufacturing steps of a field emission device representing a first embodiment of the present invention.

Referring to FIG. 1A, an insulating layer 102 having a thickness of about 2000 to 30000 angstroms is formed over a semiconductor substrate 100, such as a N-type silicon substrate. Next, a photoresist layer 104 having openings 103 is formed by a photolithography process. Insulating layer 102 is preferably silicon oxide formed by chemical vapor deposition (CVD), FSG, spin-on-glass, or organic material having low dielectric constant (low-k).

Figure 1B:
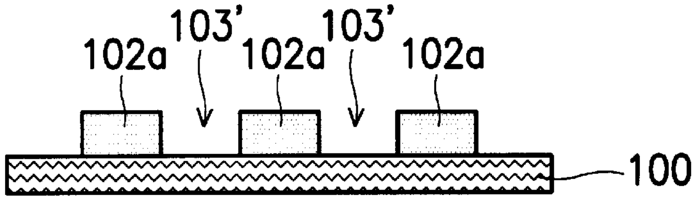

As shown in FIG. 1B, using the photoresist layer 104 as an etching mask, the insulating layer 102 is etched back by reactive ion etching (RIE) to form an insulating structures 102*a* having holes 103' exposing the surface of the semiconductor substrate 100. Next, the photoresist layer 104 is removed.

Figure 1C:
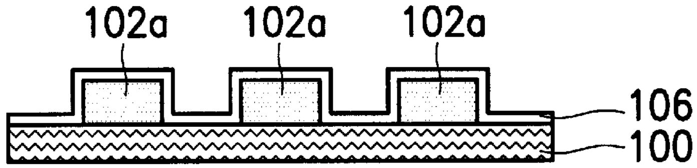

Referring to FIG. 1C, a conductive layer 106, having a thickness of about 300 to 3000 angstroms, is deposited onto the sidewalls and the upper surface of the insulating structures 102*a* by using CVD or a physical sputtering method. The conductive layer 106 is preferably polysilicon, amorphous silicon, metal such as W, Mo, Ti, Pd, Nb, Ta, Cr, Au, metallic silicide, TiW, TiN, AlN, CN, NbN, diamond, diamond-like material, or silicon carbide.

Figure 1D:
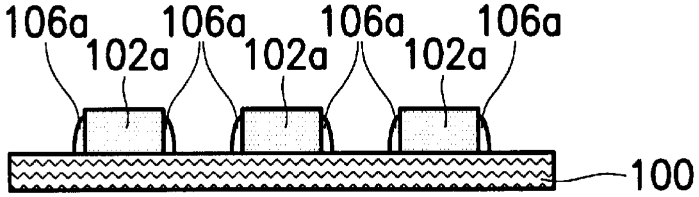

Referring now to FIG. 1D, the conductive layer 106 is etched back by a reactive ion etching method so as to leave a chimney-shaped conductive structure 106*a*, which functions as a field emitter, disposed on the sidewalls of the insulating structure 102*a*.

Figure 1E:
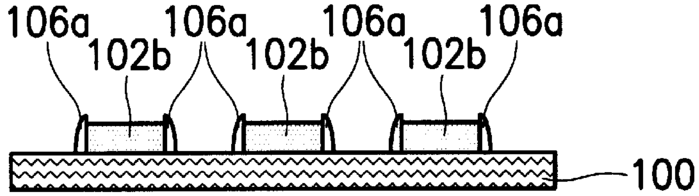

Then, as shown in FIG. 1E, the top portions of the insulating structures 102*a* are removed by a wet etching method using, for example, buffered oxide etchant (BOE), so that the upper surface of the insulating structure 102*b* is lower than that of the conductive structure 106*a*. The top of the conductive structure 106*a* is optionally sharpened by wet etching.

The process of fabricating a field emission device in the above embodiment are performed at a temperature of below 400° C.

Second Embodiment

FIG. 2A through 2E illustrate a process flow for fabricating a triode field emission device.

Figure 2A:
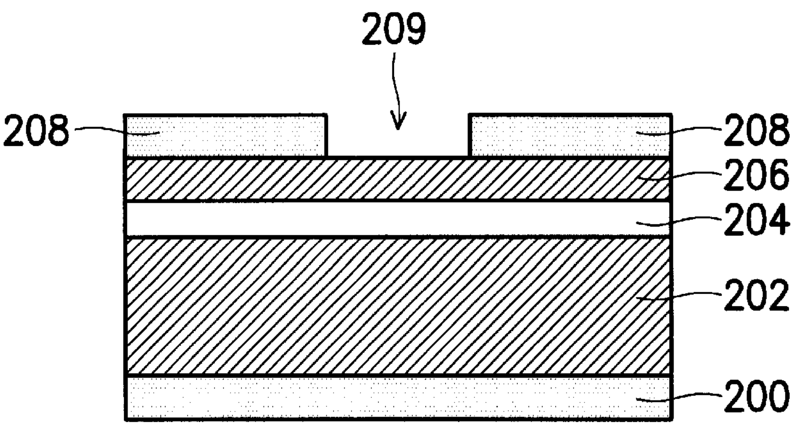
FIGS. 2A through 2E are cross-sectional side views showing the manufacturing steps of a field emission device representing a second embodiment of the present invention.

Referring to FIG. 2A, an insulating layer 202 having a thickness of about 5000 to 20000 angstroms, a conductive layer 204 having a thickness of about 1000 to 3000 angstroms, and an insulating layer 206 having a thickness of about 2000 to 10000 angstroms are sequentially formed over a semiconductor substrate 200, such as a N-type silicon substrate. Next, the photoresist layer 208 having plural openings 209 is formed by a photolithography process. The plural openings 209 are arranged in 10×10, 50×50, or 100×100 array. The insulating layer 202 is preferably silicon oxide formed by low-pressure chemical vapor deposition (LPCVD), plasma-enhanced chemical vapor deposition (PECVD), electron cyclone resonance CVD (ECR-CVD), or conventional thermal oxidation. The conductive layer 204 is preferably polysilicon, metal such as W, Mo, Pd, Nb, Ta, Cr, Al, or TiW deposited by CVD or physical vapor deposition (PVD). The insulating layer 206 is preferably silicon oxide formed by LPCVD, PECVD, ECRCVD, or photo CVD.

Figure 2B:
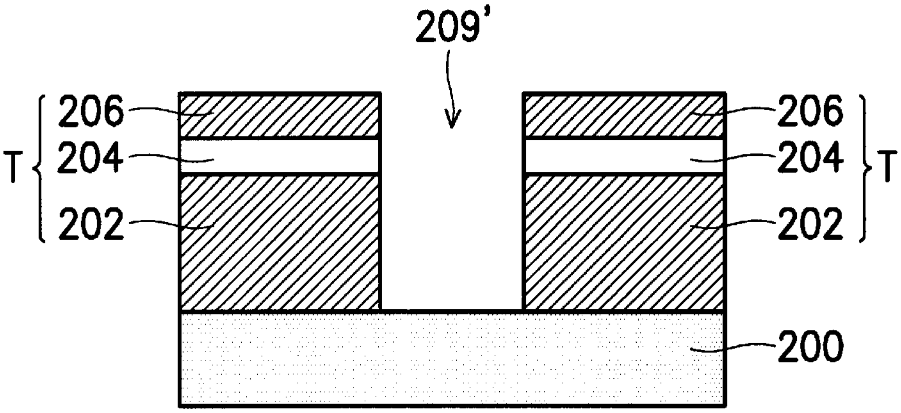

As shown in FIG. 2B, using the photoresist layer 208 as an etching mask, the insulating layer 206, the conductive layer 204 serving as a gate, and the insulating layer 202 are sequentially etched so as to form a stack structure T having a hole 209' for exposing the surface of the semiconductor substrate 200. Next, the photoresist layer 208 is removed.

Figure 2C:
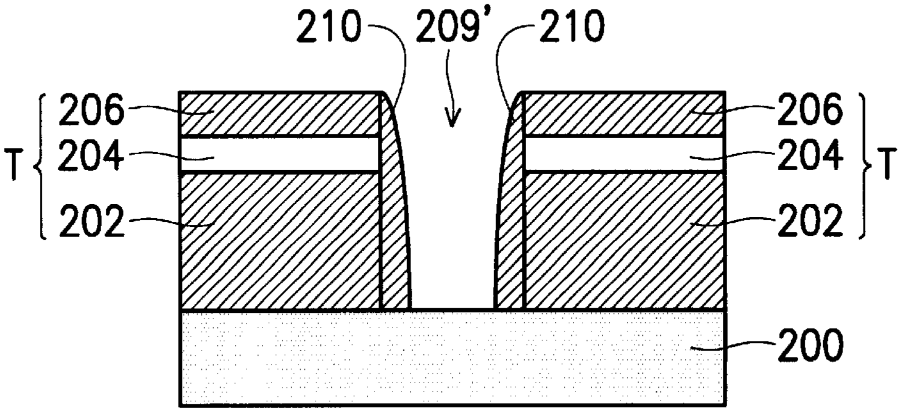

Referring to FIG. 2C, an insulating spacer 210, preferably silicon oxide, is formed onto the sidewalls of the stack structures T. The insulating spacer 210 is formed by the steps of globally depositing an insulating layer by means of CVD, and etching back the insulating layer.

Figure 2D:
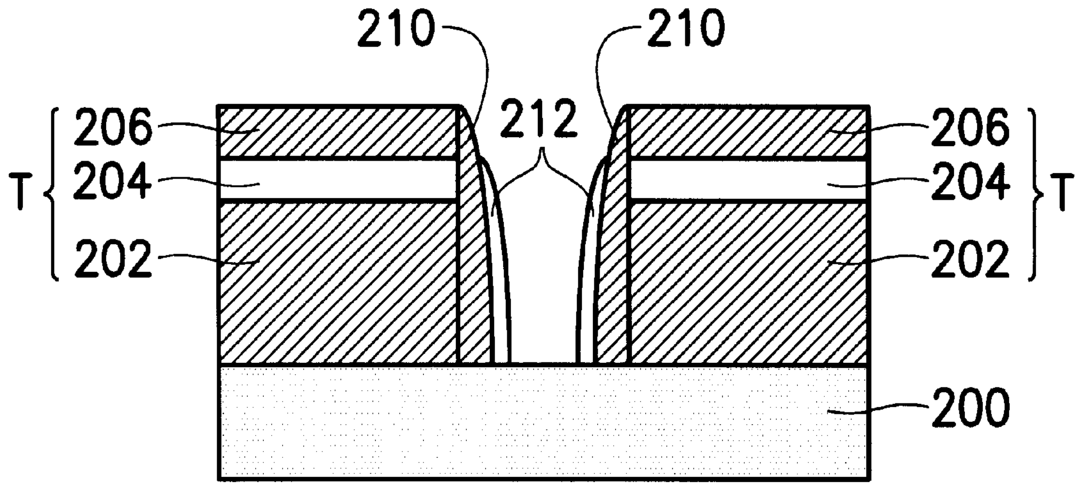

Referring now to FIG. 2D, a chimney-shaped conductive spacer 212, which serves as the field emitter, is formed onto the insulating spacer 210. The conductive layer is preferably polysilicon, amorphous silicon, metal such as W, Mo, Ti, Pd, Nb, Ta, Cr, Au, metallic silicide, TiW, TiN, AlN, CN, NbN, diamond, diamond-like material, or silicon carbide. Moreover, the conductive spacer 212 is formed by the steps of globally depositing a conductive layer by means of sputtering process or CVD, and etching back the conductive layer.

Figure 2E:
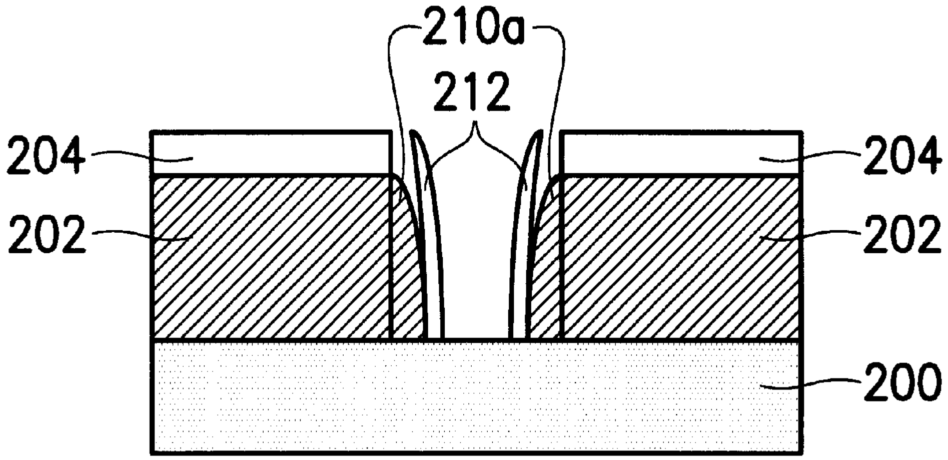

Then, as shown in FIG. 2E, the top portion of the insulating spacer 210 is removed by wet etching using, for example, buffered oxide etchant (BOE) to form an insulating spacer 210*a*, so that the upper surface of the insulating spacer 210*a* is lower than that of the conductive spacer 212. The top of the conductive spacer 212 is optionally sharpened by wet etching.

The processes of fabricating a field emission device in the above embodiment are performed at a temperature of below 400° C.

The field emission device according the present invention can be fabricated by way of conventional techniques and equipment for manufacturing integrated circuits. Complicated techniques and equipment are not required. Furthermore, the field emission device of the present invention can be manufactured at a temperature of below 400° C., and is suitable for application in flat panel displays having large area.

While the invention has been described with reference to various illustrative embodiments, the description is not intended to be construed in a limiting sense. Various modifications of the illustrative embodiments, as well as other embodiments of the invention, will be apparent to those person skilled in the art upon reference to this description. It is therefore contemplated that the appended claims will cover any such modifications or embodiments as may fall within the scope of the invention defined by the following claims and their equivalents.

What is claimed is:

1. A method of fabricating a field emission device on a semiconductor substrate, comprising the steps of:

(a) forming an insulating layer over said semiconductor substrate;

(b) selectively etching said insulating layer to form an insulating structure having a hole exposing a surface portion of said semiconductor substrate;

(c) depositing a conductive layer on an upper surface and sidewalls of said insulating structure;

(d) etching back said conductive layer, thereby leaving a chimney-shaped conductive emitter remaining on said sidewalls of said insulating structure; and (e) wet etching a portion of said insulating structure so that the upper surface of said insulating structure is lower than an upper surface of said emitter.

2. A method of fabricating a field emission device as claimed in claim 1, wherein said semiconductor substrate is an N-type silicon substrate.

3. A method of fabricating a field emission device as claimed in claim 1, wherein said insulating layer is a silicon oxide layer formed by chemical vapor deposition.

4. A method of fabricating a field emission device as claimed in claim 1, wherein said insulating layer is an FSG layer, a spin-on-glass (SOG) layer, or a low-k organic material layer.

5. A method of fabricating a field emission device as claimed in claim 1, wherein said insulating layer has a thickness of about 2000 to 30000 angstroms.

6. A method of fabricating a field emission device as claimed in claim 1, wherein step (b) further comprises the steps of:

forming a photoresist layer having openings by means of a photolithography process; and etching said insulating layer by a reactive ion etching step (RIE) using said photoresist layer as an etching mask.

7. A method of fabricating a field emission device as claimed in claim 1, wherein said conductive layer is selected from the group consisting of polysilicon, amorphous silicon, metal, metallic silicide, metallic nitride, diamond, diamond-like material, and silicon carbide.

8. A method of fabricating a field emission device as claimed in claim 1, wherein step (e) is performed with a buffered oxide etchant (BOE).

9. A method of fabricating a field emission device on a semiconductor substrate, comprising the steps of:

(a) sequentially forming a first insulating layer, a conductive layer for a gate, and a second insulating layer over said semiconductor substrate;

(b) selectively etching said second insulating layer, said conductive layer, and said first insulating layer to form a stack structure having a hole exposing a surface of said semiconductor substrate;

(c) forming an insulating spacer on sidewalls of said stack structure;

(d) forming a conductive spacer as a field emitter onto said insulating spacer; and (e) wet etching said second insulating layer and a top portion of said insulating spacer so that an upper surface of said insulating spacer is lower than an upper surface of said emitter.

10. A method of fabricating a field emission device as claimed in claim 9, wherein said semiconductor substrate is an N-type silicon substrate.

11. A method of fabricating a field emission device as claimed in claim 9, wherein said first insulating layer and said second insulating layer are silicon oxide layers formed by chemical vapor deposition.

12. A method of fabricating a field emission device as claimed in claim 9, wherein said first insulating layer and said second insulating layer are FSG layers, spin-on-glass (SOG) layers, or low-k organic material layers.

13. A method of fabricating a field emission device as claimed in claim 9, wherein step (b) further comprises the steps of:

forming a photoresist layer having openings by means of a photolithography process; and etching said second insulating layer, said conductive layer and said first insulating layer by a reactive ion etching step (RIE) using said photoresist layer as an etching mask.

14. A method of fabricating a field emission device as claimed in claim 9, wherein said conductive spacer is selected from the group consisting of polysilicon, amorphous silicon, metal, metallic silicide, metallic nitride, diamond, diamond-like material, and silicon carbide.

15. A method of fabricating a field emission device as claimed in claim 9, wherein step (e) is performed with a buffered oxide etchant (BOE).

16. A method of fabricating a field emission device as claimed in claim 9, wherein said insulating spacer in step (c) is formed by the steps of:

entirely depositing an insulating layer overlaying said stack structure and extending within said hole; and etching back said insulating layer by means of a reactive ion etching step to form said insulating spacer.

17. A method of fabricating a field emission device as claimed in claim 9, wherein said conductive spacer in step (d) is formed by the steps of:

globally depositing a conductive layer overlaying said insulating spacer; and etching back said conductive layer by means of a reactive ion etching step to form said conductive spacer.

* * * * *